United States Patent [19]
Hey-Shipton et al.

[11] Patent Number: 5,616,539
[45] Date of Patent: Apr. 1, 1997

[54] HIGH TEMPERATURE SUPERCONDUCTOR LUMPED ELEMENT BAND-REJECT FILTERS

[75] Inventors: Gregory L. Hey-Shipton, Santa Barbara; Stephan M. Rohlfing, Newbury Park; George L. Matthaei; Roger J. Forse, both of Santa Barbara, all of Calif.

[73] Assignee: Superconductor Technologies, Inc., Santa Barbara, Calif.

[21] Appl. No.: 297,289

[22] Filed: Aug. 26, 1994

Related U.S. Application Data

[63] Continuation-in-part of Ser. No. 70,100, May 28, 1993.
[51] Int. Cl.$^6$ .................. H03H 7/01; H01B 12/06
[52] U.S. Cl. .................. 505/210; 505/700; 505/701; 505/866; 333/168; 333/176; 333/185; 333/99 S
[58] Field of Search .................. 333/185, 175, 333/176, 168, 204, 99 S; 505/210, 700, 701, 866

[56] References Cited

U.S. PATENT DOCUMENTS

| | | | |
|---|---|---|---|
| 4,881,050 | 11/1989 | Swanson, Jr. | 333/185 |
| 5,175,518 | 12/1992 | Swanson, Jr. | 333/185 X |

FOREIGN PATENT DOCUMENTS

| | | | |
|---|---|---|---|
| 207015 | 9/1987 | Japan | 333/175 |
| 541263 | 1/1977 | U.S.S.R. | 333/234 |

*Primary Examiner*—Benny T. Lee
*Attorney, Agent, or Firm*—Lyon & Lyon

[57] ABSTRACT

Lumped element electrical components, such as inductors and capacitors, are formed to include high temperature superconducting materials. In the preferred embodiment, thin film epitaxial high temperature superconductors are patterned to form capacitors and inductors on low loss substrates. Preferably, a ground plane is formed on the back side of the substrate, most preferably being formed of high temperature superconducting material, or other highly conductive materials such as gold or copper. Various advantageous structures include a planar spiral structure, a zig-zag serpentine structure, a single coil structure and a double coil structure. Single layer and multilayer structures are included. Improved narrow bandpass filters, bandreject filters and high Q resonator structures are formed. Chebyshev bandpass filters are formed from multiple series connected zig-zag filter structures. Chebyshev, elliptic and quasi-elliptic bandreject filters are formed from a plurality of bandreject structures, each of which includes a zig-zag or serpentine inductor. A quasi-elliptic bandpass filter utilizes a plurality of series connected bandpass structures with planar cross-coupling of bandpass structures.

22 Claims, 10 Drawing Sheets

HIGH TEMPERATURE SUPERCONDUCTOR LUMPED ELEMENT BAND-REJECT FILTERS

RELATED APPLICATION INFORMATION

This application is a continuation-in part of application Ser. No. 08/070,100, filed May 28, 1993, entitled "Lumped Element Circuits".

FIELD OF THE INVENTION

This invention relates to electrical circuits including lumped elements, especially inductors and capacitors. More particularly, it relates to microwave circuits such as filters which include some superconducting components.

BACKGROUND OF THE INVENTION

Electrical components come in various conventional forms, such as inductors, capacitors and resistors. A lumped electrical element is one whose physical size is substantially less than the wave length of the electromagnetic field passing through the element. A distributed element is one whose size is larger than that for a lumped element. As an example, a lumped element in the form of an inductor would have a physical size which is a relatively small faction of the wave length used with the circuit, typically less than ⅛ of the wavelength.

Inductors, capacitors and resistors have been grouped together into useful circuits. Resonant circuits and filters are formed including such elements. A particularly useful application of such elements are filters useful in the microwave range, such as above 500 MHz.

Considering the case of conventional microwave filters, there have been basically three types. First, lumped element filters have used separately fabricated air wound inductors and parallel plate capacitors, wired together into a filter circuit. These conventional components are relatively small compared to the wave length, and accordingly, make for a fairly compact filters. However, the use of separate elements has proved to be difficult in manufacture, resulting in large circuit to circuit differences. The second conventional filter structure utilizes mechanical distributed element components. Coupled bars or rods are used to form transmission line networks which are arranged as a filter circuit. Ordinarily, the length of the bars or rods is ¼ or ½ of the wave length at the center frequency of the filter. Accordingly, the bars or rods can become quite sizeable, often being several inches long, resulting in filters over a foot in length. Third, printed distributed element filters have been used. Generally they comprise a single layer of metal traces printed on an insulating substrate, with a ground plane on the back of the substrate. The traces are arranged as transmission line networks to make a filter. Again, the size of these filters can become quite large. The structures also suffer from various responses at multiples of the center frequency.

Various thin-filmed lump element structures have been proposed. Swanson U.S. Pat. No. 4,881,050, issued Nov. 14, 1989, discloses a thin-film microwave filter utilizing lumped elements. In particular, a capacitor $\pi$ network utilizing spiral inductors and capacitors is disclosed. Generally, a multilayer structure is utilized, a dielectric substrate having a ground plane on one side of the substrate and multiple thin-film metal layers and insulators on the other side. Filters are formed by configuring the metal and insulation layers to form capacitive $\pi$-networks and spiral inductors. Swanson U.S. Pat. No. 5,175,518 entitled "Wide Percentage Band-Width Microwave Filter Network and Method of Manufacturing Same" discloses a lumped element thin-film based structure. Specifically, an alumina substrate has a ground plane on one side and multiple layer plate-like structures on the other side. A silicon nitride dielectric layer is deposited over the first plate on the substrate, and a second and third capacitor plates are deposited on the dielectric over the first plate.

Historically, such lumped element circuits were fabricated using normal, that is, non-superconducting materials. These materials have an inherent loss, and so a result, the circuits have various degree of lossiness. For resonant circuits such as those used to build narrow bandwidth filters, the loss is particularly critical. The Q of a lumped element device is a measure of its power dissipation or lossiness. Lumped element resonant circuits fabricated from normal metals have Q's less than 1,000 of microwave frequencies which are dominated by the loss of the lumped inductor.

With the discovery of high temperature superconductivity in 1986, attempts have been made to fabricate electrical devices from these materials. The microwave properties of the high temperature superconductors has improved substantially since their discovery. Epitaxial superconductive thin films are now routinely formed and commercially available. See, e.g., R. B. Hammond, et al., "Epitaxial $Tl_2Ca_1Ba_2Cu_2O_8$ Thin Films With Low 9.6 GHz Surface Resistance at High Power and Above 77K", Appl. Phy. Lett., Vol. 57, pp. 825–27, 1990. Various filter structures and resonators have been formed. Other discrete circuits for filters in the microwave region have been described. See, e.g., S. H. Talisa, et al., "Low-and High-Temperature Superconducting Microwave Filters," IEEE Transactions on Microwave Theory and Techniques, Vol. 39, No. 9, September 1991, pp. 1448–1554.

The need for compact, reliable narrow band filters has never been stronger. Applications in the telecommunications fields are of particular importance. As more users desire to use the microwave band, the use of narrow band filters will increase the number of users in the spectrum. Of most particular interest is the range from 800 to 2,200 Mhz. In the United States, the 800 to 900 Mhz range is used for cellular communications. The personal communications services are planned for the 1,800 to 2,200 MHz range.

Despite the clear desirability of improved electrical circuits, including the known desirability of converting circuitry to include superconducting elements, efforts to date have been less than satisfactory in all regards. It has proved to be especially difficult in substituting high temperature superconducting materials to form circuits without severely degrading the intrinsic Q of the superconducting film. These problems include circuit structure, radiative loss and tuning and have remained in spite of the clear desirability of an improved circuit.

SUMMARY OF THE INVENTION

Novel lumped element inductors and capacitors are formed from high temperature superconducting materials alone or in combination with conventional materials. In the preferred embodiment, thin-film epitaxial high temperature superconductors are patterned to form lumped capacitors and inductors on low loss substrates. These include all those compatible with the formation of high temperature superconducting films (e.g., lanthanum aluminate, sapphire and magnesium oxide).

Various novel and advantageous structures are described. Both bandpass and bandreject filters are formed. Generally, both bandpass and bandreject structures utilize series and shunt connected capacitors and inductors. The performance of these filters is dominated by the loss (or Q) in the inductor portion of the resonators.

In the preferred embodiment, a zig-zag inductor is formed from a high temperature superconducting film and is used as the inductor portion of the lumped element. The pattern is formed in a meandering or serpentine pattern. Advantageously, this structure would not ordinarily require a cross-over to provide connection at both ends of the lumped element. This structure has the added benefit that the opposing currents in adjacent sections of the inductor greatly reduce any losses due to radiative effects.

In the preferred embodiment, bandreject structures, bandpass structures, and combinations of them are formed using zig-zag or serpentine planar inductors for the inductors in the resonator portion of the circuit. In the basic form shown, bandreject structure capacitively couple a conductor to a resonator comprising a first capacitor pad, a series connected zig-zag or serpentine inductor, and an end capacitor pad. In the basic form of the bandpass structure, a signal is capacitively coupled to a series connected inductor, which is in turn connected in series to an output capacitor structure.

A Chebyshev bandreject filter is preferably formed from a plurality of side coupled short zig-zag resonator structures, each comprising an input pad, a zig-zag or serpentine inductor connected to the input capacitor pad at one end, and connected to an output capacitor pad at the other end. These resonators are connected using 90 degree lumped element phase shifters, which optionally may be formed from zig-zag inductors. As these phase shifters are non-resonant, they need not be formed of the very low loss zig-zag inductor structure, but may be formed from spiral or other shaped inductors without significant degredation in filter performance.

An elliptic bandreject filter is formed from a plurality of bandreject structures coupled together using phase shifters (as in the Chebyshev case) but with varying values of phase shift. The bandreject structures preferably include an input capacitor pad., a zig-zag or serpentine inductor connected to the input pad, and a terminal pad connected to the end of the inductor. In another embodiment, the lumped element phase shifter may be replaced by transmission lines having an impedance and phase shift selected so as to simulate the lumped element version.

A quasi-elliptic bandpass filter is formed from a plurality of series connected bandpass resonators wherein planar cross-coupling of resonators is formed.

Multi-layer structures utlilize a high temperature superconductor film with coupling to the inductor via a multi-level structure. As the resonator performance is dominated by the inductor, capacitive coupling sections may be formed from normal metal rather than high temperature superconductors for some applications.

High Q structures may be formed with the disclosed devices. Resonators with Q greater than 1,000 are easily achievable. Further, narrow bandpass filters are conveniently formed.

Accordingly, it is an object of this invention to provide novel and highly advantageous structures for lumped element inductors and capacitors.

It is yet a further object of this invention to provide for lumped elements formed of high temperature superconductor materials, with or without the inclusion of normal metals.

It is yet a further object of this invention to provide for improved filters.

It is another object of this invention to provide for improved narrow bandpass filters for use in telecommunications.

It is yet a further object of this invention to provide lumped elements useful for high Q circuits.

It is yet a further object of this invention to provide structures which preserve the low loss nature of high temperature superconductors yet perform valuable electrical functions as inductors and capacitors.

DETAILED DESCRIPTION OF THE INVENTION

Figure 1:
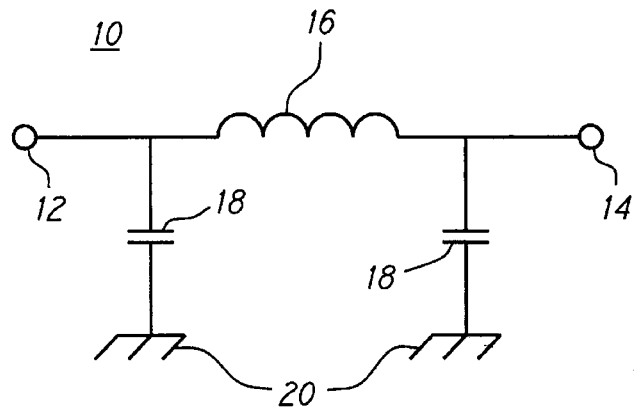
FIG. 1 shows a circuit diagram of a simple $\pi$ network.

FIG. 1 shows an electrical circuit for a $\pi$ network 10. One or more $\pi$ networks 10 may be combined as known to those skilled in the art. Generally, there is an input node 12 and an output node 14. An inductor 16 couples the input node 12 to the output node 14. The positive coupling to ground is performed by capacitors 18 coupling the ends of inductor 16 to the ground 20.

Any of the structures described herein may be formed using any type of superconducting materials. Preferably, high temperature superconducting materials, i.e., those which superconduct around or above 77K. The preferred materials are epitaxial superconductors, with low loss in the microwave and radio frequency range. Preferred superconductors include the thallium containing superconductors, which generally include thallium, barium, calcium and copper oxide (TBCCO), thallium, barium and copper oxide (TBCO) or the YBCO superconductors.

Figure 2:
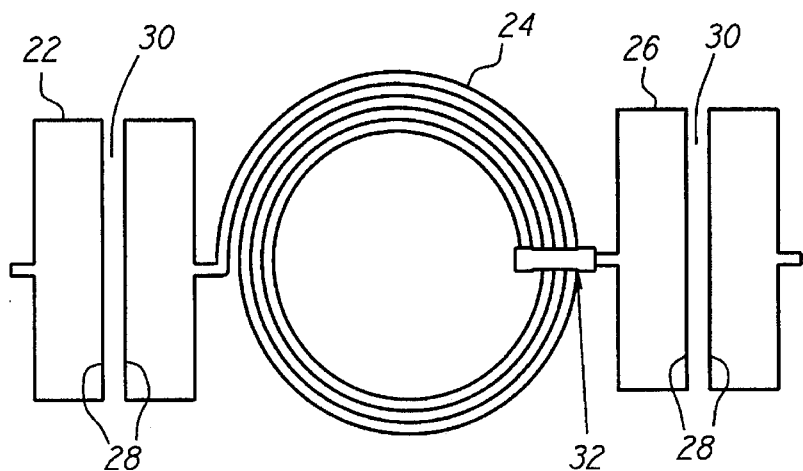
FIG. 2 shows a plan view of a multi-turn planar spiral inductor.

FIG. 2 shows a plan view of a multi-turn planar spiral inductor in accordance with this invention. Input capacitor 22 connects to spiral inductor 24 and provides output to capacitor 26. In the preferred embodiment, the capacitors 24 and 26 are formed from thin-film high temperature superconducting materials. The capacitors 22 and 24 are formed by the coupling capacitance between the simple pad structures shown. However, they may be of any desired shape as known to those skilled in the art, such as planer, inter-digital or multi-layers structures. Adjacent faces 28 define a gap 30 defining the space between the capacitor plates. Optionally, dielectric material may be placed in the gap 30. In the preferred embodiment, no additional material is provided between the faces 28. The inductor 24 is preferably formed from a thin-film epitaxial superconductor. The inductor 24 may be patterned with anywhere from a fraction of a turn to many turns. The spiral may continue optionally through to the center of the spiral.

While FIG. 2 shows a circular or spiral arrangement, the shape of the inductor may be of any form, with the preferred forms being spiral or rectangular. Connection to the inductor 24 may be direct, or as desired, via a crossover 32. The crossover 32 provides a connection from one end of the inductor 24 to the output capacitor 26. The crossover 32 may be formed through any conventional technique such as by utilizing normal metal bonding wires, metal air or dielectrically supported bridges, or multilayer high temperature superconductor crossovers. Additionally, all high temperature superconducting crossovers are possible via formation of crystal defects in the superconductor so as to render the material locally nonsuperconductive.

The structure of FIG. 2 shows an inductor 24 having 2.5 turns. In one actual device, the line width is 50 microns, the line spacing is 20 microns, resulting in a total inductance of about 18.6 nanoHenries at 0.85 GHz. The resistance of the high temperature superconductor line was about 1.2 milliOhms. In the preferred embodiment, the crossover 32 is formed using high temperature superconductor, such as multi-layer crossover structure. Performing the crossover from normal metals, such as gold or copper, the added inductor loss from the crossover together with the resistance of the contact resistance to the film can be relatively large. At this frequency, a 1 mil diameter bond wire can add an extra 10 milliOhms to the overall inductor loss. Accordingly, high temperature superconductor crossover 32 is preferred.

The structure of FIG. 2 is formed on a substrate. Preferably, the substrate should be chosen from the group of substrates that are compatible with the growth of low loss, high temperature superconducting films, including lanthanum aluminate, sapphire and magnesium oxide. Thallium containing superconductors formed on Lanthanum Aluminate provide good results. Films of thallium on lanthanum aluminate are commercially available. The backside of the substrate, that is, the side opposite that on which the capacitors 22 and 26 and inductor 24 have been formed, is preferably formed into a ground plane. In the most preferred embodiment, the ground plane comprises a high temperature superconductor plane. Optionally, the ground plane may be formed of normal metal, such as gold or high quality copper, though with some degradation in performance.

The self resonant frequency for the structure of FIG. 2 is four times higher than its operating frequency. Accordingly, this structure is particularly useful for simple filter structures. Other filter structures which have finite frequency transmission poles, such as elliptic type filters, can use the self-resonance property of these inductors in the filter design. Very selective filters may be constructed without the addition of additional elements.

Figure 3:
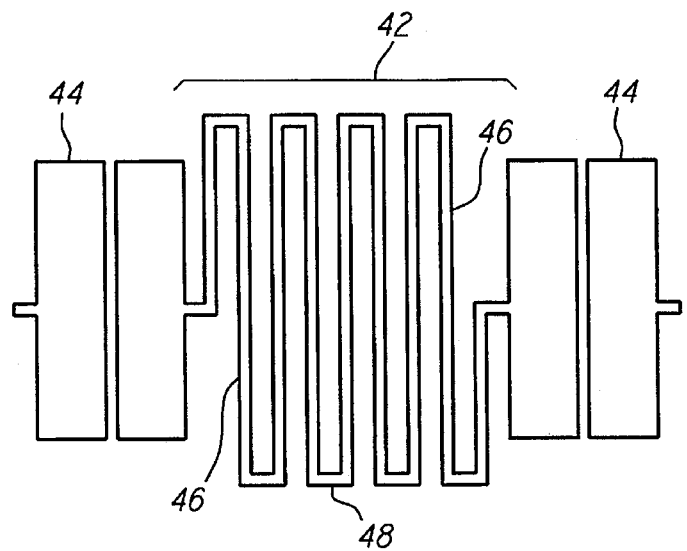
FIG. 3 shows a plan view of a zig-zag inductor.
Figure 4:
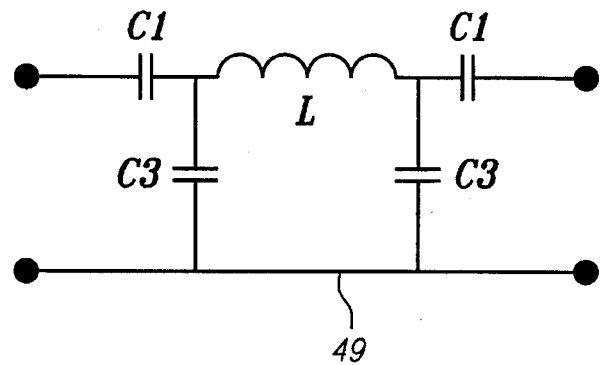
FIG. 4 shows a circuit component representation of the structure of FIG. 3.

FIG. 3 shows a plan view of a zig-zag type inductor. The inductor 42 is shown coupled to capacitor 44. The capacitor structure is as described in connection with FIG. 2 and need not be repeated here. The inductor 42 may be formed in any serpentine or zig-zag manner. Generally, long runs 46 of the inductor 42 are parallel to one another. End portions 48 provide the continuous path between runs 46. The structure of FIG. 4 generally would not require a crossover, such as shown as crossover 32 in FIG. 2. Accordingly, such a structure as shown in FIG. 4 has a much higher Q than all the other structures due to the serpentine nature of the structure and the lack of a crossover connection. Generally, this structure is particularly beneficial for low loss narrow band circuits where out of band performance is not overly critical. Particular applications include elliptical filters where self-resonance can be used to accurately place finite frequency poles of very high Q in a filter response.

FIG. 4 shows a circuit component representation of the zig-zag inductor structure of FIG. 3. The input and output capacitors 44 in FIG. 3 are labelled C1 in FIG. 4. The inductor 42 is labelled L in FIG. 4 and is shown to connect in series between the input capacitor and the output capacitor. The capacitive coupling across the inductor L is shown in FIG. 4 as capacitance C2. The coupling of the capacitor 44 and inductor 42 to the second conduction line 49 are shown as parallel connections of the capacitors C3. The second conduction line 49 is not shown in FIG. 3, but would be a structure such as a conductive ground plane disclosed on the opposite side of a substrate supporting the capacitors 44 and inductor 42.

Broadly, the structural features of FIGS. 3, 5, 7, 9, 11 and 13 are generally as described with respect to FIG. 2 and need not be repeated in detail here. Generally, the structure is formed preferably from patterned thin-film high temperature superconductors formed on a substrate. A ground plane is provided on the backside of the substrate, preferably formed of high temperature superconductor or normal metals suitable for radio frequency or microwave application, such as gold or high quality copper.

Figure 5:
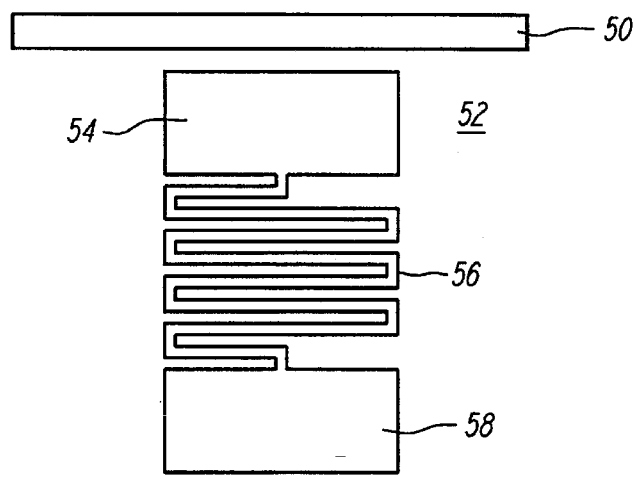
FIG. 5 shows a plan view of a shunt bandreject structure.

FIG. 5 shows a simple version of a bandreject filter structure. A transmission line 50 is in electromagnetic contact with the lumped element structure 52. In the preferred embodiment, the lumped element structure 52 includes an input pad 54 connected to the inductor 56 which optionally terminates at pad 58. The zig-zag inductor 56 has proved to be particularly advantageous in such bandreject structures. The conduction line 50 may or may not be formed from superconducting materials. Preferably, the lumped element 52 is constructed solely from superconducting materials. As to dimensions, the length of the lumped element in a direction transverse to the transmission line 50 was 4.4 millimeters, and the width in a direction parallel to the conduction line 50 was 4 millimeters. The inductor 126 is approximately 3 centimeters in length.

Figure 6:
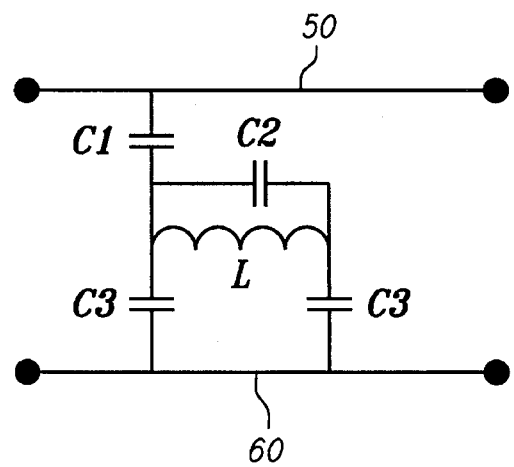
FIG. 6 shows a simplified circuit component representation of the bandreject structure of FIG. 5.

FIG. 6 shows a circuit component representation of the bandreject structure of FIG. 5. The transmission line 50 is similarly labelled on FIGS. 5 and 6. The ground plane 60 is shown in FIG. 6, but not in FIG. 5 where the conductor 60 may comprise a ground plane formed on the backside of the substrate supporting the conductor 50 and the lumped element 52. The capacitive coupling between the conduction line 50 and the input pad 54 is labelled C1 in FIG. 6. The inductor 56 is represented by the inductor L. The capacitance across the inductor 56 from the input pad 54 to the terminal pad 58 is labelled C2. The capacitive coupling to the second conduction line 60 is shown by the two parallel capacitors labelled C3.

Figure 7:
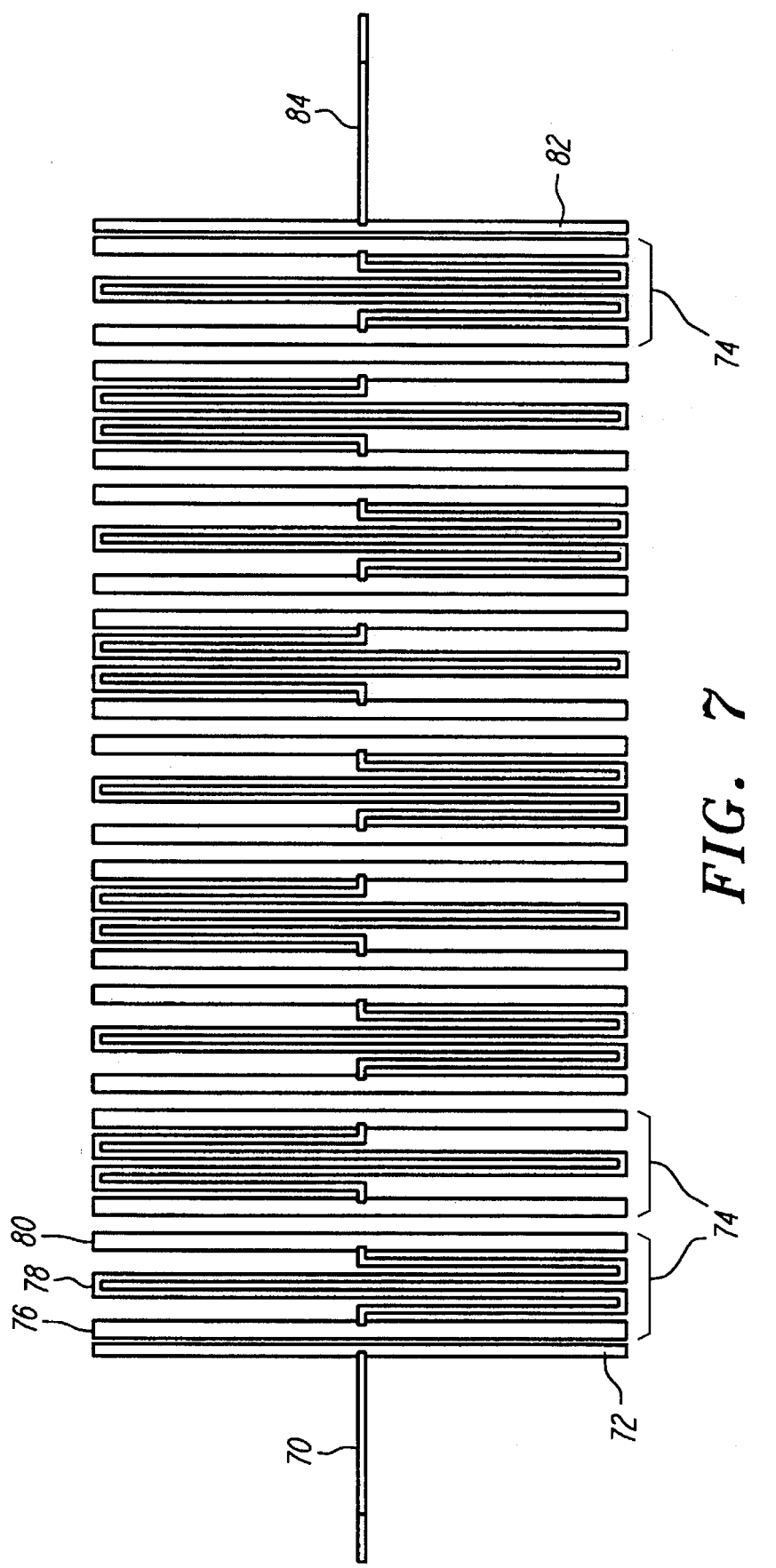
FIG. 7 shows a plan view of a 9 resonator Chebyshev bandpass filter layout.

FIG. 7 shows a plan view of a lumped element Chebyshev bandpass filter layout. In the preferred embodiment, a plurality of zig-zag filter structures of the type shown in FIG. 3 are utilized in conjunction. In a Chebyshev bandreject filter, all of the rejection bands are centered at substantially the same frequency. Structurally, in the preferred embodiment, an input connection 70 is formed as a line or pad, as desired. The input 70 connects to a input coupling structure 72. A plurality of zig-zag resonant structures 74 are placed laterally adjacent to one another in a side-by-side manner. In the structure of FIG. 7, there are 9 zig-zag structures 74. Each zig-zag structure 74 generally comprises a input pad 76, which is coupled to the inductor 78, which terminates in connection to the output pad 80. The inductor 78 may be formed in any serpentine or zig-zag manner, though the preferred embodiment is with relatively long substantially parallel lines so as to reduce the radiative effects. The output 80 of a first zig-zag structure 74 is capacitively coupled to the input pad 78 of the nearest neighbor zig-zag structure 74. The input coupling structure 72 couples to the first coupling pad 76 of the first zig-zag structure 74. The last (right most) zig-zag structure 74 is capacitively coupled to the output coupling structure 82, which is further connected to an output line or pad 84. Throughout this patent, the use of terms such as input and output or left and right are used for ease of description, and are not intended to be limitative of the description.

Figure 8:
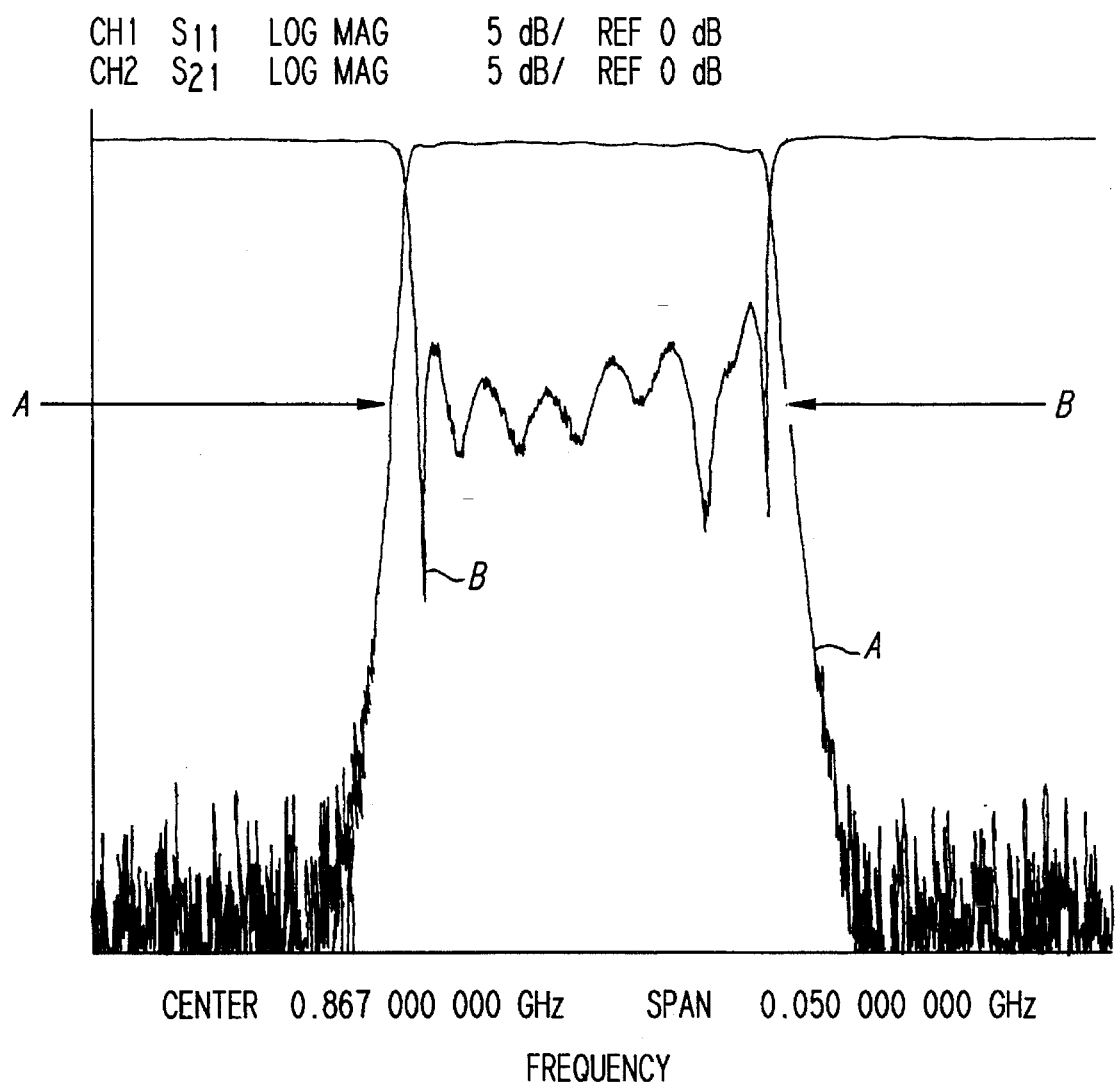
FIG. 8 shows the insertion loss and return loss as a function of frequency for the circuit of FIG. 7.

FIG. 8 shows a graph of the insertion loss (labelled A) and return loss (labelled B) as a function of frequency for the Chebyshev bandpass filter layout of FIG. 7. The center frequency is 867 MHz and the span is 50 MHz.

Figure 9:
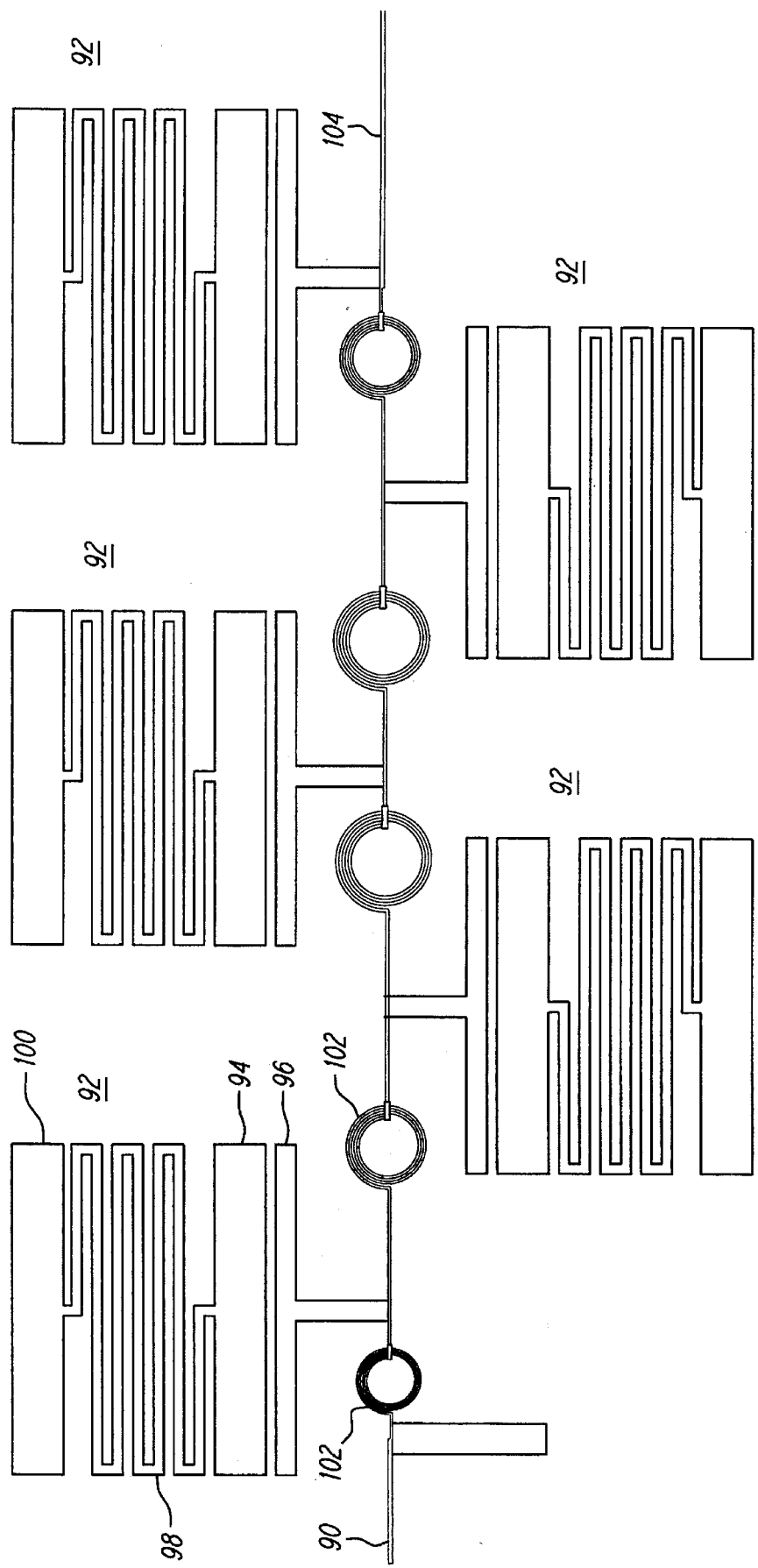
FIG. 9 shows a plan view of a lumped element elliptic bandreject filter.

FIG. 9 shows a plan view of a lumped element elliptic bandreject filter. An input line or pad 90 is coupled to one or more bandreject structures 92. Each bandreject structure 92 has, in the preferred embodiment, a structure similar to FIG. 3. Specifically, there is a first end portion 94 which is capacitively coupled to a coupling member 96. The end member 94 is electrically connected to the inductor 98, which is preferably formed in a serpentine or zig-zag manner. Optionally, the inductor 98 is electrically connected to an end pad 100. The specific elements of the bandreject structure 92 have been identified on one of the labelled structures 92. The labelling for the other structures would be the same. The input pad or line 90 is preferably coupled to series inductor 102. In the preferred embodiment, a spiral shaped inductor is used. This structure has a relatively low Q, but does not degrade the performance as the series elements are for interconnection purposes and are not intended to be resonant structures. A series inductor 102 is preferably located between each of the resonant coupling structures 96 on each of the bandreject structures 92. An output pad or line 104 provides an output connection for the elliptic bandreject filter.

Figure 10:
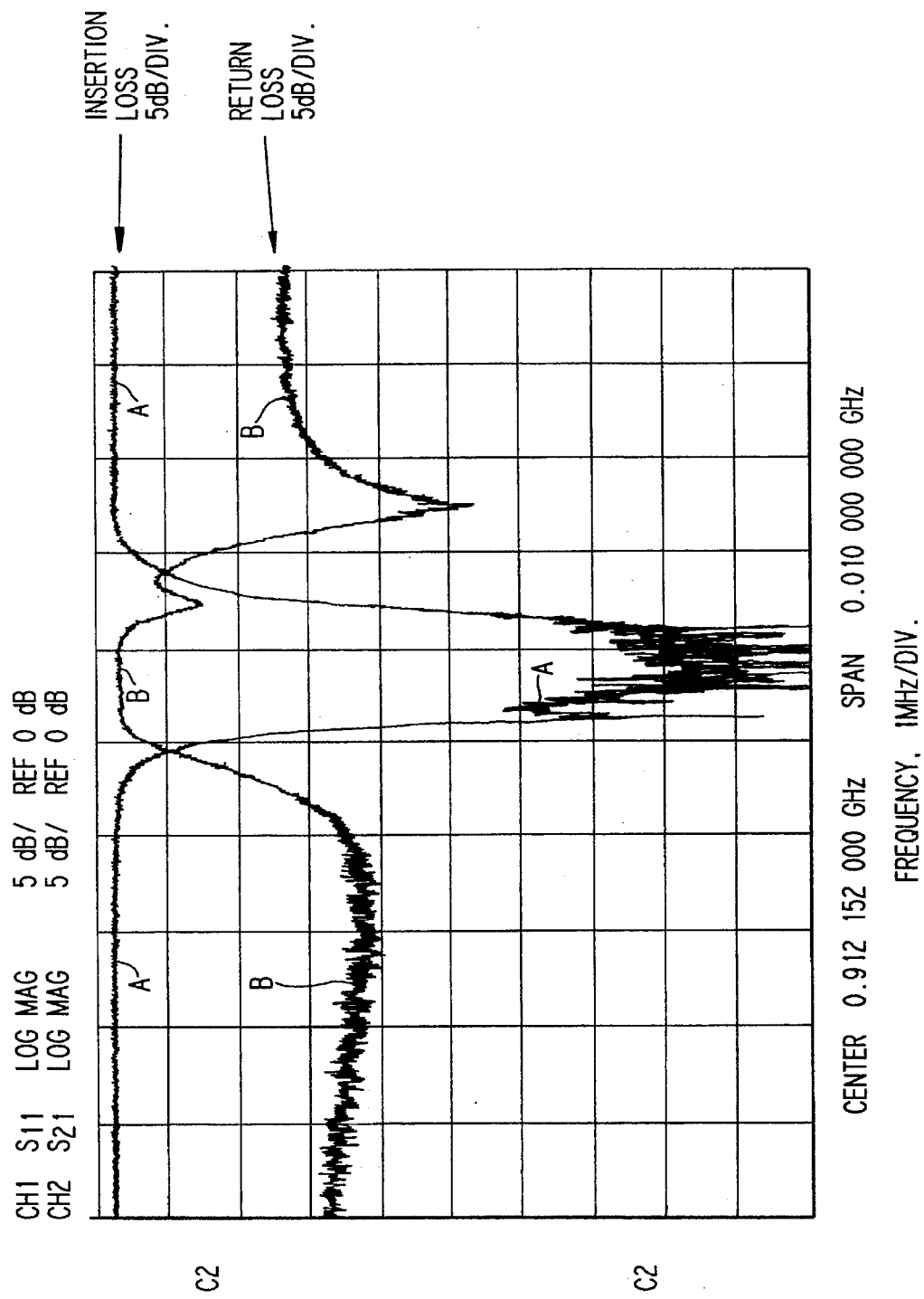
FIG. 10 shows the insertion loss and return loss as a function of frequency for the circuit of FIG. 9.

FIG. 10 shows the insertion loss and return loss as a function of frequency for the circuit of FIG. 9. The frequency is labelled on the x-axis, with the center frequency being 912.152 MHz, and the scale being 10 MHz per division. The insertion loss (labelled A) and the return loss (labelled B) are shown on FIG. 10. The y-axis scale is 5 dB per division.

Figure 11:
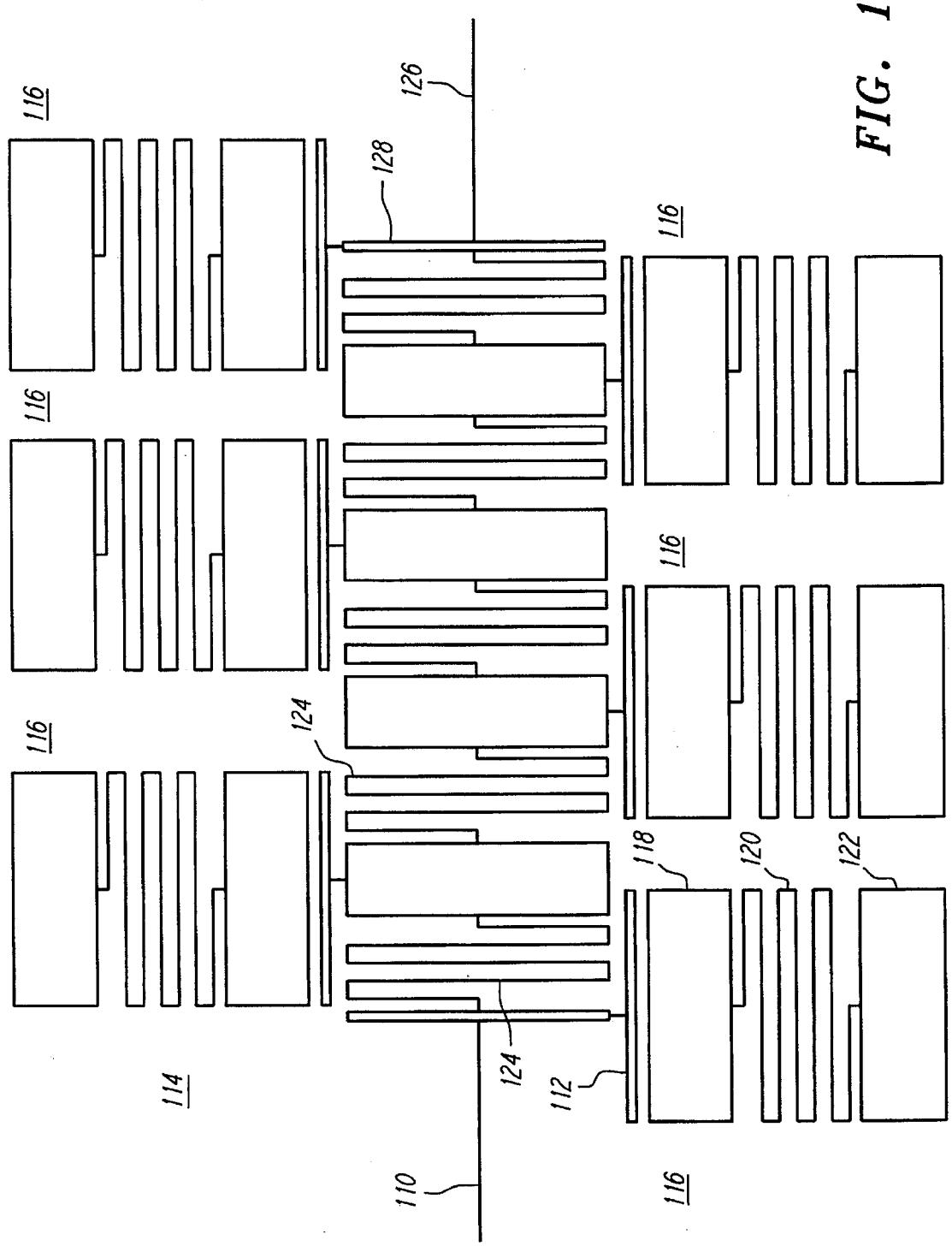
FIG. 11 shows a plan view of a Chebyshev bandreject filter.

FIG. 11 shows a plan view of a elliptic or Chebyshev bandreject filter. A input pad or line 110 connects to a first coupling member 112. In the preferred embodiment, the filter 114 consists of a plurality of bandreject structures 116. Each bandreject structure 116 consists of a first end portion 118. The end portion 118 is capacitively coupled to coupling member 112. The end member 118 is electrically connected to the inductor 120, which is connected in series to the end pad 122. Each of the various bandreject structures 116 preferably has a similar set of elements, and accordingly, the numbers are called out only on one of the bandreject structures 116. Each of the various bandreject structures 116 are connected by a conductor 124, preferably arranged to provide series inductance. In the preferred embodiment, the inductor 124 is formed in a serpentine or zig-zag pattern. In the bandreject filter structure of FIG. 11, six separate bandreject elements 116 are utilized. Inductance 124 is added between each of the separate bandreject structures 116. An output line or pad 126 is coupled to the last coupling structure 128 for the last bandreject structure 116.

Figure 12:
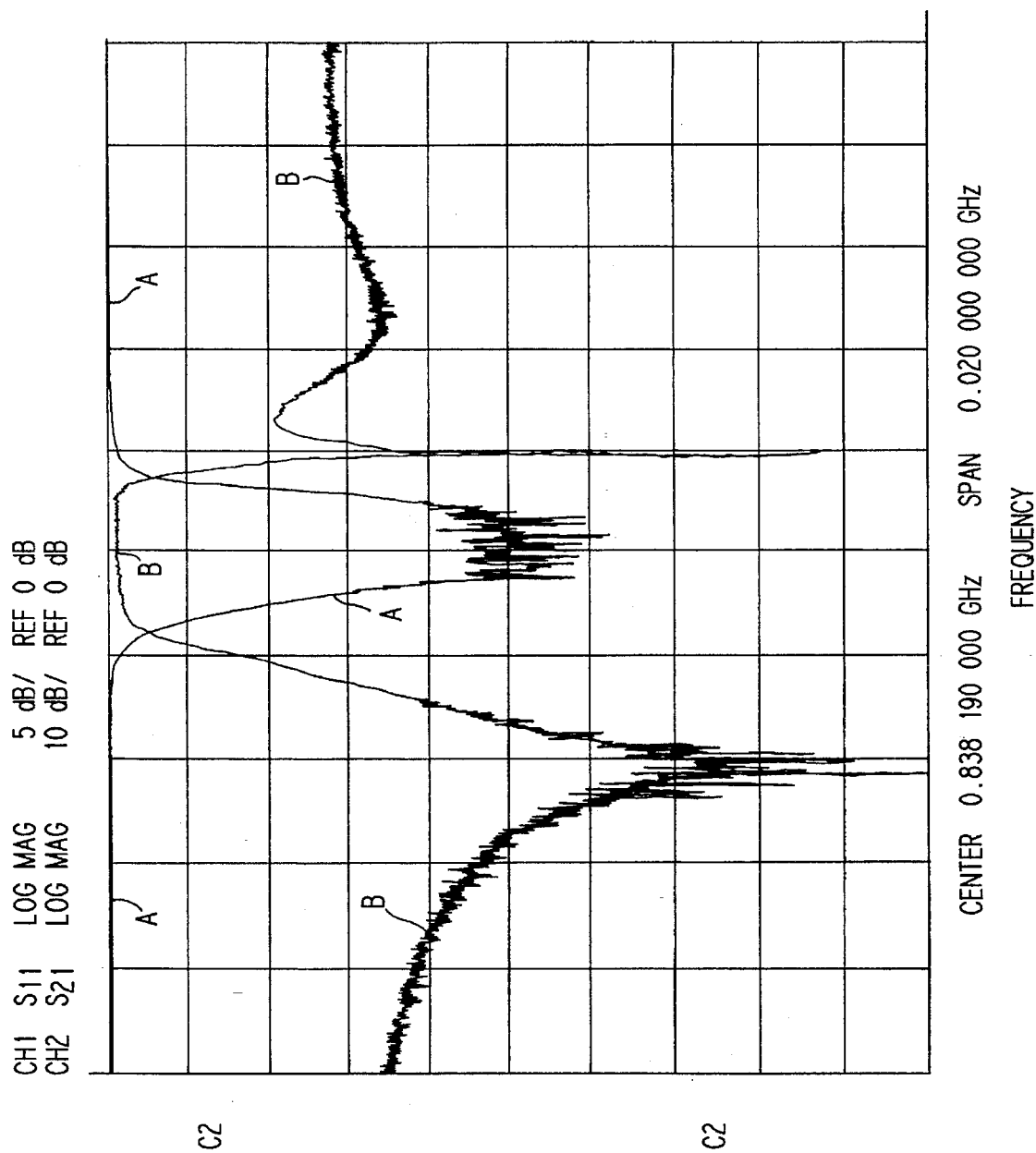
FIG. 12 shows the insertion loss and return loss as a function of frequency for the circuit of FIG. 11.

FIG. 12 shows the insertion loss and return loss as a function of frequency for the circuit of FIG. 11. The x-axis shows the frequency, with the center frequency being 838.19 MHz, and the divisions representing two MHz per division. The insertion loss is labelled A on FIG. 12 and has a y scale of 10 dB per division. The return loss is labelled B and has a y division scale of 5 dB per division.

Figure 13:
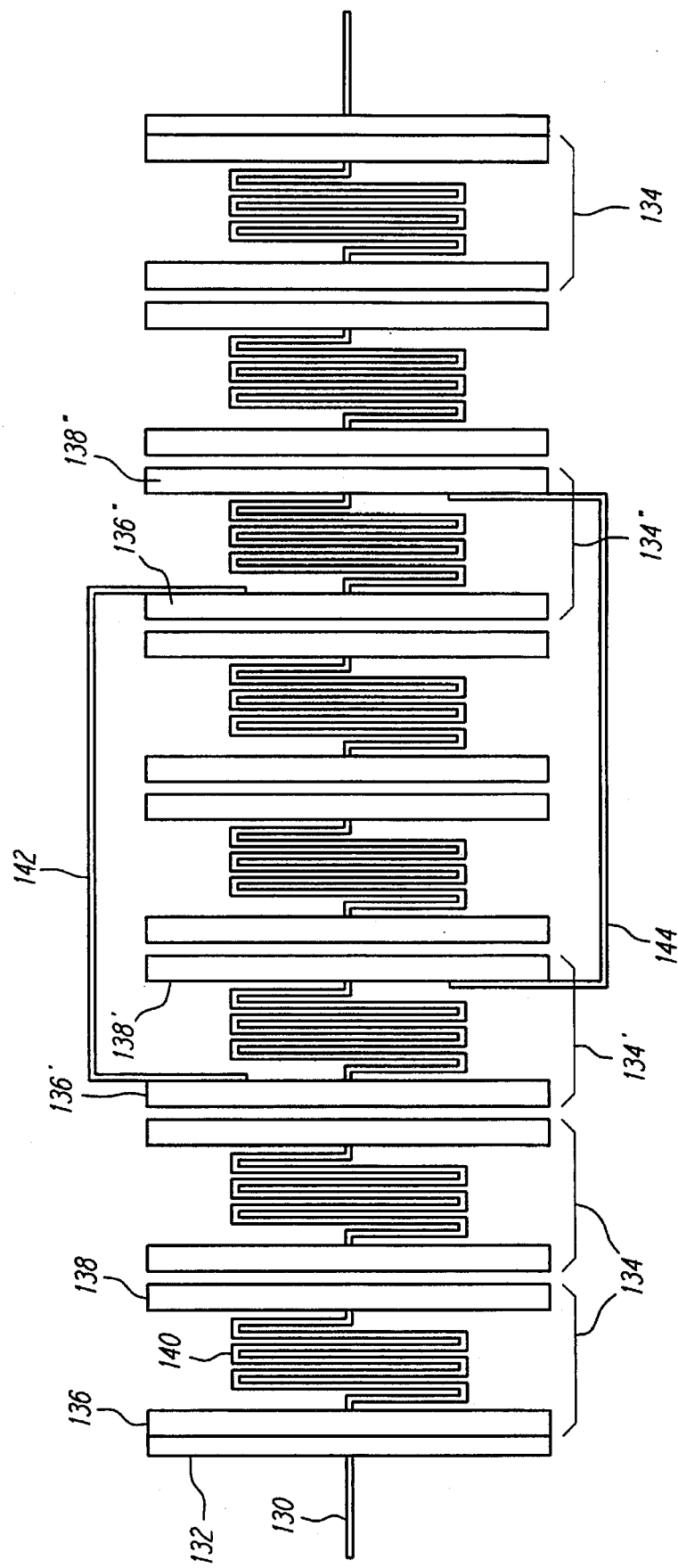
FIG. 13 shows a plan view of a quasi-elliptic bandpass filter.

FIG. 13 shows a plan view of a quasi elliptic bandpass filter. An input pad or line 130 terminates in a first coupling structure 132. The coupling structure in turn couples to a plurality of resonant structures 134. Each resonant structure 134 in the preferred embodiment has a first input coupling structure 136 and an output coupling structure 138 interconnected by an inductor 140. In the preferred embodiment, the inductor 140 is formed in a serpentine or zig-zag pattern. Each of the various resonant structures 134 has the same combination of elements and accordingly, is labelled only on the first resonant structure 134.

The quasi-elliptic bandpass filter of FIG. 13 is formed by providing electrical shorting connection between various resonant structures 134. A first shorting connection 142 connects the input 136' of the resonant structure 134' to the input structure 136" of the resonant structure 134". Preferably, a second electrical short 144 connects the output structure 138' of the resonant structure 134' to the output structure 138" of the resonant structure 134". In the embodiment shown, two resonant structures 134 are spanned by the shorting connections 142 and 144. In the structure of FIG. 13, there are eight separate resonant structures 134.

Figure 14:
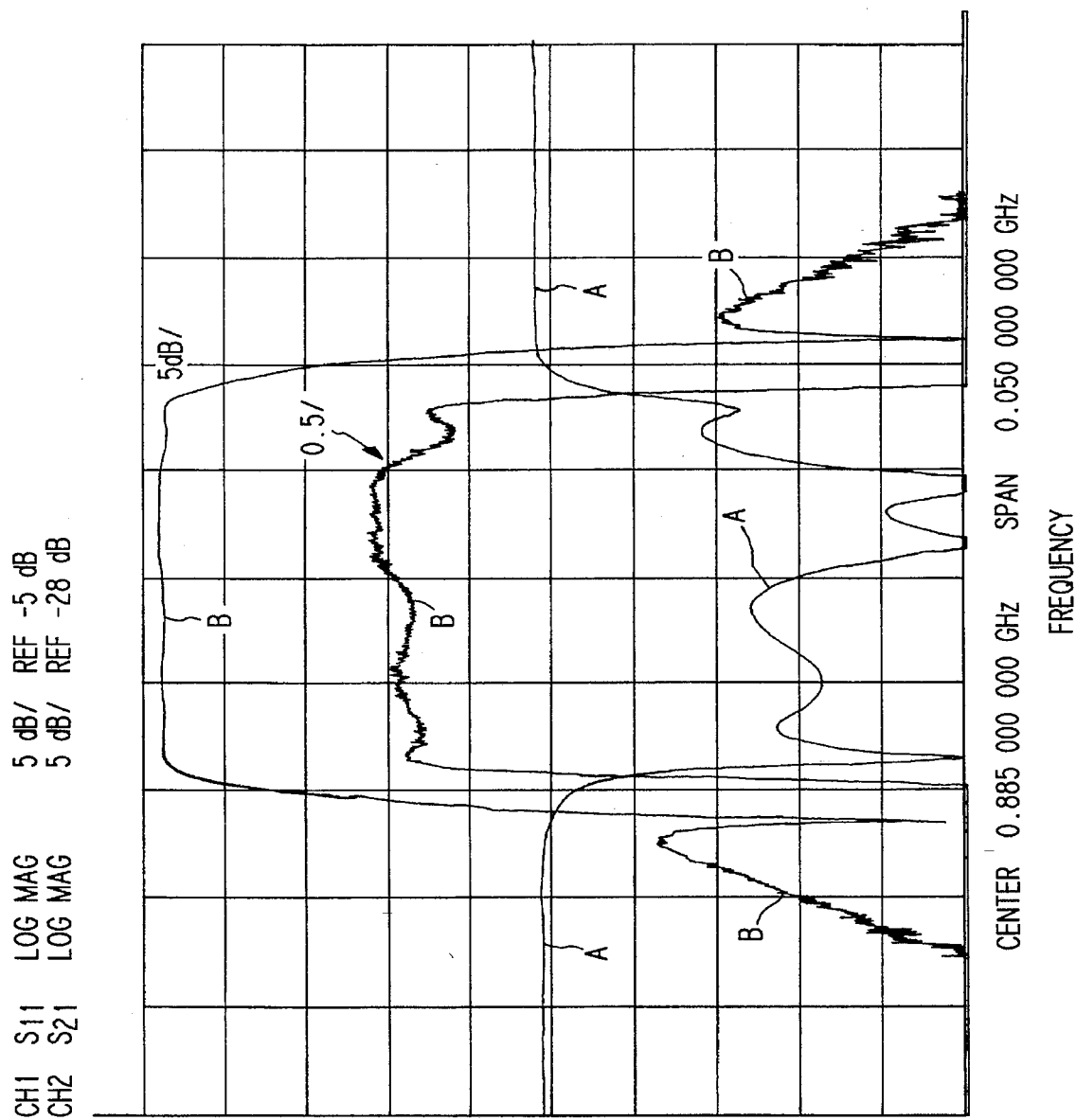
FIG. 14 shows the insertion loss and return loss as a function of frequency for the circuit of FIG. 13.

FIG. 14 shows the insertion loss and return loss as a function of frequency for the circuit of FIG. 13. The x-axis shows the frequency, with a center frequency of 885.0 MHz on a scale of 5 MHz per division. The return loss is labelled A on FIG. 14 and the insertion loss is labelled B shown at 5 dB/division and 0.5 dB/division.

EXPERIMENTAL RESULTS

Various structures described above have been fabricated and tested. The results are reported here.

The planar spiral structure of FIG. 2 was formed using a double sided thin-filmed superconductor on lanthanum aluminate. The coil was spiraled. Two and one half turns were used. The unloaded Q of the circuit was 3,215. The center resonant frequency was 936.497 Mhz.

The structure of FIG. 3 (having 6 long runs as opposed to the 7 runs as shown in FIG. 3) was fabricated with a gold back plane. The circuit was fabricated from thallium superconductor on lanthanum aluminate. The unloaded Q was measure as 7,647. The center frequency was measured as 1,315.53 MHz. A similar resonator structure was made from thallium superconductor on both the circuit side and the back plane side of a lanthanum aluminate substrate, with a resonant frequency of 841 MHz and a measured unloaded Q value of 26,536, measured at −65 dBm input power. Also, a similar resonator structure was made from thallium superconductor on both the circuit side and the back plane side of a magnesium oxide substrate, with a resonant frequency of 816 MHz and a measured unloaded Q value of 48,910, measured at −20 dBm input power. This zig-zag structure has repeatedly demonstrated unloaded Q's in the 20,000 to 50,000 range when built from double sided superconductors which is clearly superior to anything yet constructed using normal metal conductors.

Although the foregoing invention has been described in some detail by way of illustration and example for purposes of clarity and understanding, it will be readily apparent to those of ordinary skill in the art in light of the teachings of this invention that certain changes and modifications may be made thereto without departing from the spirit or scope of the appended claims.

We claim:

1. A superconductive bandreject structure comprising:
   a substrate,
   a transmission line disposed on the substrate, and a superconductive lumped element structure comprising:
   an input pad, and
   a zig-zag conductor comprising an inductor and having one end
   thereof connected to the input pad and having another end thereof ending in a terminal end,
   the input pad and zig-zag conductor being disposed on the substrate and the input pad being electromagnetically coupled to the transmission line, the structure being operably configured for bandreject operation.

2. The superconductive bandreject structure of claim 1 wherein the lumped element further includes a termination pad disposed on the substrate and connected to the terminal end of the inductor.

3. The superconductive bandreject structure of claim 1 wherein the structure comprises a bandreject filter.

4. The superconductive bandreject structure of claim 1 wherein the superconductive lumped element structure comprises a high temperature superconductor.

5. The superconductive bandreject structure of claim 4 wherein the high temperature superconductor is a thallium containing superconductor.

6. The electrical circuit of claim 5 wherein the thallium containing superconductor is $Tl_2Ca_1Ba_2Cu_2O_8$.

7. The electrical circuit of claim 4 wherein the superconductive lumped element is a YBCO superconductor composition.

8. The superconductive bandreject structure of claim 1 wherein the zig-zag conductor is a serpentine shape.

9. The electrical circuit of claim 1 wherein the substrate is selected from the group consisting of: lanthanum aluminate, sapphire and magnesium oxide.

10. A superconductive band reject structure comprising:
    a substrate,
    a transmission line disposed on the substrate, and a superconductive lumped element structure which is epitaxial to the substrate comprising:
    an input pad, and
    a zig-zag conductor comprising an inductor and having one end thereof connected to the input pad and having another end thereof ending in a terminal end,
    the input pad and zig-zag conductor being disposed on the substrate and the input pad being electromagnetically coupled to the transmission line, the structure being operably considered for band reject operation.

11. A filter comprising:
    a substrate,
    an input coupling structure, an output coupling structure, and a plurality of planar lumped element bandpass resonator structures each disposed on the substrate,
    the lumped element bandpass resonator structures being connected in series, and configured for filtering operation,
    wherein each bandpass resonator structure comprises:
    an input pad,
    an output pad, and
    a zig-zag inductor connecting the input and output pads,
    a first lumped element bandpass resonator structure of said plurality of planar lumped element bandpass resonator structures having an input pad thereof adjacent the input coupling structure,
    the output pad of a particular one of said plurality of bandpass resonator structure, being capacitively coupled to the input pad of an adjacent bandpass resonator structure of said plurality of planar lumped element bandpass resonator structures, and
    a last lumped element bandpass resonator structure of said plurality of planar lumped element bandpass resonator structures having an output pad thereof adjacent the output coupling structure.

12. The filter of claim 11 wherein the filter is a Chebychev filter.

13. The filter of claim 11 further including planar cross-coupling connection between different bandpass resonator structures.

14. The filter of claim 13 wherein said planar cross-coupling connection includes at least one planar cross-coupling connection connects an input pad of a bandpass resonator structure of said plurality of planar lumped element bandpass resonator structures to an input pad of another bandpass resonator structure of said plurality of planar lumped element bandpass resonator structures.

15. The filter of claim 14 wherein said planar cross-coupling connections includes a planar cross-coupling connection connecting an output pad of one planar bandpass resonator structure of said plurality of planar lumped element bandpass resonator structures to an output pad of another bandpass resonator structure of said plurality of planar lumped element bandpass resonator structures.

16. The filter of claim 13 wherein said planar cross-coupling connection includes at least one planar cross-coupling connection connects an output pad of one planar bandpass resonator structure of said plurality of planar lumped element bandpass resonator structures to an output pad structure of another bandpass resonator structure of said plurality of planar lumped element bandpass resonator structures.

17. The filter of claim 13 wherein said planar cross-coupling connection includes an input coupling structure of a first bandpass resonator structure of said plurality of planar lumped element bandpass resonator structures is connected to an input coupling structure of a second bandpass resonator structure of said plurality of planar lumped element bandpass resonator structures and the output coupling structure of the said first bandpass resonator structure is connected to the output coupling structure of the said second bandpass resonator structure.

18. A bandreject filter comprising:
    a transmission line having an input for the filter and an output for the filter, a plurality of bandreject structures shunt coupled to the transmission line, at least one of said bandreject structures comprising:

an input pad, a zig-zag inductor having a first end connected to the input pad, and having a second end defining a terminal end, where the input pad of each bandreject structure is capacitively coupled to the transmission line, the filter operably configured for bandreject operation.

19. The filter of claim 18 wherein a respective bandreject structure further includes a corresponding termination pad connected to the terminal end.

20. A band reject filter comprising:

a transmission line including an inductor having an input for the filter and an output for the filter, a plurality of band reject structures shunt coupled to the transmission line, at least one of said bandreject structures comprising:

an input pad, a zig-zag inductor having a first end connected to the input pad, and having a second end defining a terminal end, where the input pad of each band reject structure is capacitively coupled to the transmission line, the filter operably configured for band reject operation.

21. The filter of claim 20 wherein the inductor is a spiral inductor.

22. The filter of claim 20 wherein the inductor is a zig-zag structure.

* * * * *